United States Patent [19]

Greene et al.

[11] Patent Number: 4,717,443

[45] Date of Patent: Jan. 5, 1988

[54] MASS TRANSPORT OF INDIUM PHOSPHIDE

[75] Inventors: Peter D. Greene, Harlow; Daniel S. O. Renner, Sawbridgeworth, both of United Kingdom

[73] Assignee: Standard Telephones and Cables, PLC, London, England

[21] Appl. No.: 735,754

[22] Filed: May 20, 1985

[30] Foreign Application Priority Data

Jun. 28, 1984 [GB] United Kingdom ............... 8416417

[51] Int. Cl.⁴ .................. C30B 23/02; C30B 23/06; C30B 25/16; C30B 29/40
[52] U.S. Cl. .................................. 437/228; 156/611; 156/DIG. 70; 156/DIG. 89; 156/610; 148/DIG. 65; 148/DIG. 119; 427/255.2
[58] Field of Search ............... 427/86, 255.2; 372/7; 156/610, 611, DIG. 89, DIG. 70; 148/DIG. 65, DIG. 119

[56] References Cited

U.S. PATENT DOCUMENTS 4,365,588 12/1982 Jolly ................................. 156/611

FOREIGN PATENT DOCUMENTS 58365 5/1977 Japan ....................... 156/DIG. 70

OTHER PUBLICATIONS

Hasson et al., Appl. Phys. Lett., 43, 403+(1983).
Z. L. Liau and J. N. Walpole, "a Novel Technique for GaInAsP/InP Buried Heterostructure Laser Fabrication", Appl. Phys. Lett., vol. 40, No. 7, pp. 568–570 (1 Apr. 1982).
T. R. Chen, L. C. Chiu, K. L. Yu, U. Koren., A. Hasson, S. Margalit and A. Yariv, "Low Threshold InGaAsP Terrace Mass Transport Laser on Semi–Insulating Substrate", Appl. Phys. Lett., vol. 41, No. 12, pp. 1115–1117 (15 Dec. 1982).
A. Hasson, L. C. Chiu, T. R. Chen, U. Koren, Z. Rav–Noy, K. L. Yu, S. Margalit, and A. Yariv, "Selective Low–Temperature Mass Transport in InGaAsP/InP Lasers", Appl. Phys. Lett., vol. 43, No. 5 (1 Sep. 1983).

Primary Examiner—Gary P. Straub
Attorney, Agent, or Firm—Dennis P. Clarke

[57] ABSTRACT

A mass transport process for use in the manufacture of semiconductor devices, particularly but not exclusively low threshold semiconductor lasers in the InP/InGaAsP system, involves the arrangement of a cover wafer (18) of the material to be grown adjacent to a semiconductor wafer (15) on which the material is to be grown, their disposition together with a crystalline alkali halide (20) in a crucible (16), and heating the crucible, which is almost but not completely sealed, in a hydrogen stream.

For the manufacture of InP/InGaAsP lasers and the growth of InP, the alkali halide may comprise KI, RbI or CsI and a controlled amount of In metal (21) may be optionally contained in the crucible (16) to control the balance between growth of InP for defining the laser active region and erosion of InP from other areas of the wafer. Growth is achieved at temperatures comparable with liquid phase epitaxy processing temperatures.

5 Claims, 2 Drawing Figures

MASS TRANSPORT OF INDIUM PHOSPHIDE

BACKGROUND OF THE INVENTION

This invention relates to a process for the mass transport of indium phosphide for use in the manufacture of semiconductor devices, in particular but not exclusively MTBH lasers.

SUMMARY OF THE INVENTION

According to the present invention there is provided a mass transport process for use in the manufacture of semiconductor devices including the steps of disposing in an unsealed crucible a semiconductor wafer on which material is to be grown by mass transport, a cover wafer of the material to be grown and a crystalline alkali halide, and heating the unsealed crucible in a reducing atmosphere at a temperature and for a time consistent with a required amount of growth.

BRIEF DESCRIPTION OF THE DRAWINGS

Embodiments of the invention will now be described with reference to the accompanying drawings, in which.

Figure 2:
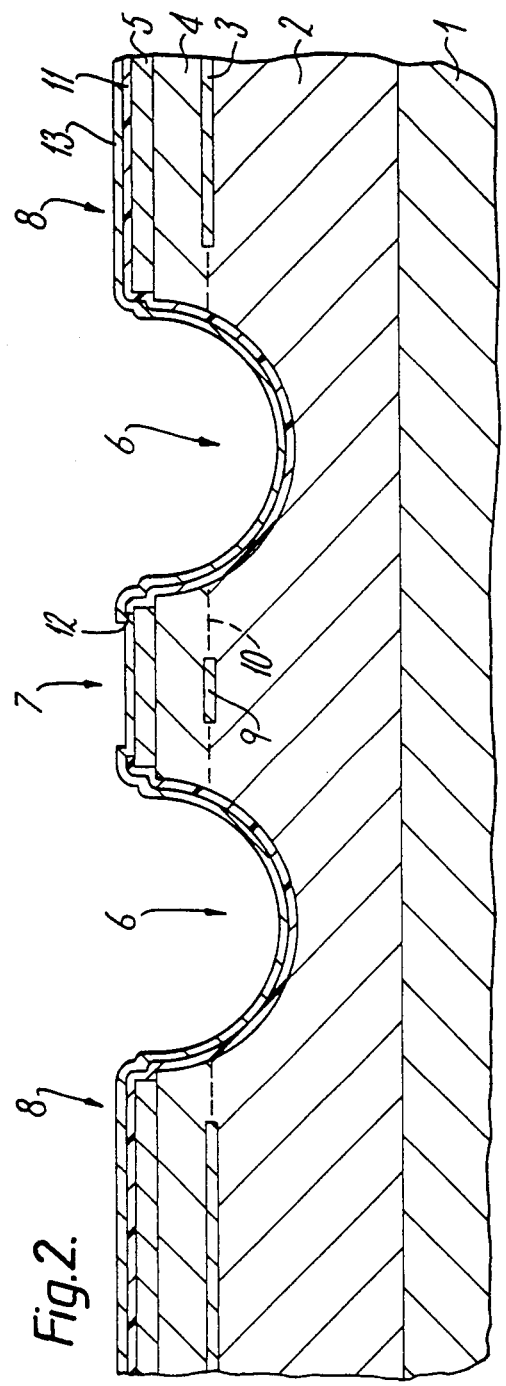
FIG. 2 illustrates a cross-section through a mass transport buried heterostructure (MTBH) laser.

The MTBH laser illustrated in FIG. 2 is formed in a multilayer structure comprising an n-type InP substrate 1, having formed thereon by conventional liquid phase epitaxy, an n-type InP layer 2, an undoped GaInAsP active layer 3, a p-type InP layer 4 and a p-type GaInAsP contacting layer 5. By a process of undercut etching, following etching of two elongate (transverse to the section shown) channels 6 whereby to define a mesa 7, the active layer 3 is selectively etched under layer 4 in the mesa 7 and the shoulders 8. Etching is carried out until the active layer in the mesa is of a predetermined width and comprises an active region 9. The recesses left by the removed portions of the active layer 3 under layer 4 are then filled with InP by a mass transport process, this being indicated by dashed lines 10. Subsequently a silicon dioxide layer 11 is deposited over the entire structure, a window 12 opened in layer 11 at the top of the mesa and the structure is metallised (layer 13). The laser structure shown in FIG. 2 includes a p-type GaInAsP contacting layer and the selective undercut etching may be carried out by the process described in our co-pending U.K. Application No. 8416412 published as No. 2,160,823A, and corresponding to U.S. application Ser. No. 729,181, filed May 1, 1985 by Daniel S. O. Renner. Alternatively the p-type GaInAsP layer 5 may be omitted and the p-type InP layer 4 diffused with zinc to improve electrical contact thereto. The present invention is not concerned with the structure of the laser only the mass transport process used to fill the etched recesses whereby to completely surround the active region 9 with material. Whereas the description specifically refers to mass transport processes in MTBH lasers the mass transport process is not to be considered as restricted thereto, and may be applicable to other single or integrated devices.

The fabrication of low threshold semiconductor lasers in the $InP+In_{1-x}Ga_xAs_yP_{1-y}$ materials system is an established technique, see for example Z. N. Liau and J. N. Walpole, Appl. Phys. Lett., 40, 568 (1982) or T. R. Chen et al, Appl. Phys. Lett. 41, 1115, (1982). This process is based on the fact that vapour pressures over convex surfaces are greater than the corresponding vapour pressures over concave surfaces, so that material, in this case InP, can be transported through the vapour phase to fill narrow recesses where the active layer has been etched away, the recesses contain a sharply curved concave surface on which material can grow.

In the transport of InP, vapourization and migration of the P can occur quite readily in a hydrogen atmosphere via the reversible reaction

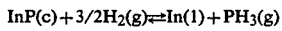

However, the volatility of In is very much lower, so that the rate controlling step is the evaporation and transportation of In. The rate of In transport can be increased by the use of higher temperature, since it increases rapidly as the temperature exceeds 700° C., but the exposure of the semiconductor material to such higher temperatures has disadvantages, particularly because of zinc diffusion from the p-type regions of the semiconductor, which zinc provides the required doping thereof. However, the In transport rate can also be increased by the presence of halogens within the system, see, for example, A. Hasson et al, Appl. Phys. Lett., 43, 403 (1983). The mass transport process described therein is performed with etched multilayer wafer structure disposed in a sealed evacuated ampoule which is placed in a furnace with a temperature gradient of $\sim 2°$ C. cm$^{-1}$ along the axis of the ampoule. The wafer is positioned at the "cold" end of the ampoule and source material for the mass transport process disposed at the "hot" end of the ampoule. Using InP as the source material ($\sim 730°$ C.) the etched recesses in the wafer ($\sim 690°$ C.) were filled in one hour, but with the source at less than 690° C. no filling occured. With a small amount of iodine added to the InP source material the mass transport process is accelerated and heating at 600° C. for 30 minutes or so was sufficient to fill a recess, however unprotected regions of the wafer were etched unacceptably. To reduce the chemical activity of the iodine, the pure iodine was replaced by InI and this resulted in mass transport without etching at 600° C., which was found to be the optimum temperature.

We have found that halogens can be introduced without the need to employ a sealed and evacuated ampoule. The mass transport process is instead carried out in an open tube system. A wafer 15 (FIG. 1) to be processed is contained in a graphite crucible 16, having a lid 17, which is almost, but not completely, sealed. The wafer 15 is disposed grooved (channelled) face downwards on an InP cover slice or wafer 18. The crucible 16 is disposed in a tube 19 through which hydrogen flows during the process, and the tube and its contents are heated in a furnace (not shown). With only the wafer 15 and cover slice 18 in crucible 16 significant mass transport was found to occur only at temperatures higher than 700° C. The process was very temperature sensitive and the rate of transport increased rapidly as the temperature exceeded 700° C. Under these conditions the rate of mass transport was limited by the low vapour pressure of In above InP.

When KI granules 20 were introduced into the same crucible 16, being disposed in a recess of the crucible under a graphite grid 14, however, mass transport was found to take place at temperatures as low as 600° C.

Figure 1:
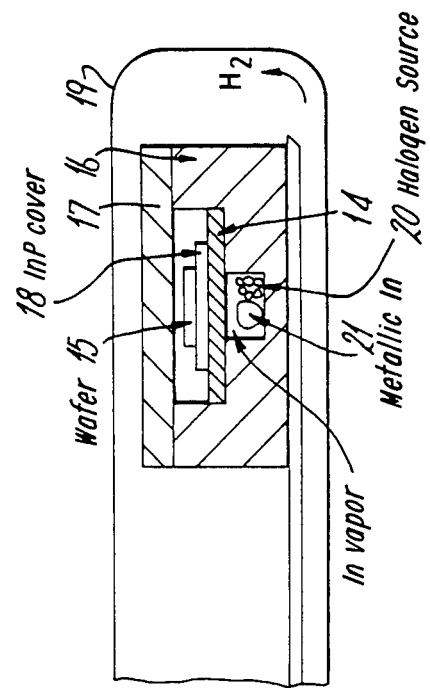
FIG. 1 illustrates, schematically, apparatus for use in the mass transport of the present invention.

With KI on its own, however, whilst significant material growth occured on concave surfaces, etching from convex and flat surfaces was excessive, at least for MTBH laser manufacture. By disposing a controlled amount of metallic indium 21 in the crucible together with the KI it was found possible to achieve the correct balance between etching and deposition of InP. Optimum conductions for MTBH laser processing were obtained at 660° C., with a total temperature cycle of two hours, which compares favourably with the standard temperatures used for liquid phase epitaxy, about 650° C., which are employed for growing the layers of the wafer and subsequent processing at which temperature will not, therefore, adversely affect the wafer layers. The process described with reference to FIG. 1 is a simple and controllable one for achieving mass transport and has been employed to produce MTBH lasers with threshold currents below 7 mA and output powers up to 35 mW.

Whereas the above refers to the use of KI granules as a source of the iodine, the invention is not to be considered so limited and other crystalline alkali halides may alternatively be used to introduce a halogen to increase the transport rate of the indium. For example, RbI or CsI may be used. It is considered that any crystalline alkali halide would be useful in this respect.

Thermodynamic calculations on the possible chemical equilibria, suggest that not only the H atmosphere but also the graphite may play an active role. It is well established that the heavier alkali metals K, Rb and Cs form intercalation compounds with graphite. It is thought that the dominant equilibrium responsible for the transport of InP is probably:

$$KI(c) + InP(c) + 3/2 H_2(g) + C_n(c) \rightleftharpoons InI(g) + PH_3(g) + C_nK(c).$$

We claim:

1. A mass transport process, for use in the manufacture of semiconductor devices, including the steps of disposing in an unsealed graphite crucible a semiconductor wafer on which InP is to be grown by mass transport, covering the semiconductor wafer with a cover wafer of InP from which InP is to be mass transported to the semiconductor wafer, disposing transport agent material in the crucible, the transport agent material including a material selected from the group consisting of crystalline KI, crystalline RbI and crystalline CsI, and heating the unsealed crucible in a hydrogen atmosphere at a temperature and for a time consistent with a required amount of growth.

2. A mass transport process as claimed in claim 1, wherein the transport agent material further includes a sufficient amount of metallic indium to balance growth of InP on concave surfaces against etching thereof on convex and flat surfaces.

3. A mass transport process as claimed in claim 2, wherein the crucible is heated at a temperature of the order of 660° C.

4. A mass transport process, for use in the manufacture of mass transport buried heterostructure lasers in the InP/InGaAsP system, including the steps of disposing in a graphite crucible semiconductor wafer on which InP is to be grown by mass transport, covering the semiconductor wafer with a cover wafer of InP from which InP is to be mass transported to the semiconductor wafer, disposing transport agent material in the crucible, the transport agent material including crystalline KI and the sufficient amount of metallic indium to balance growth of InP on concave surfaces against etching thereof on convex and flat surfaces, almost but not completely sealing the crucible, and heating the unsealed crucible in a hydrogen atmosphere at a temperature and for a time consistent with the required amount of growth.

5. A mass transport process as claimed in claim 4, wherein the unsealed crucible is heated at a temperature of the order of 660° C.

* * * * *